(12) United States Patent
Yu et al.

(10) Patent No.: US 9,922,749 B2
(45) Date of Patent: Mar. 20, 2018

(54) POLYAMIDE COMPOSITION HAVING HIGH THERMAL CONDUCTIVITY

(71) Applicant: RHODIA OPERATIONS, Aubervilliers (FR)

(72) Inventors: Yeong-Chool Yu, Seoul (KR); Tae-Kyun Kim, Gyeong-gi-do (KR)

(73) Assignee: Rhodia Operations, Aubervilliers (FR)

(*) Notice: Subject to any disclaimer, the term of this patent is extended or adjusted under 35 U.S.C. 154(b) by 0 days.

(21) Appl. No.: 14/347,843

(22) PCT Filed: Sep. 25, 2012

(86) PCT No.: PCT/EP2012/068837
§ 371 (c)(1),
(2) Date: Mar. 27, 2014

(87) PCT Pub. No.: WO2013/045426
PCT Pub. Date: Apr. 4, 2013

(65) Prior Publication Data
US 2014/0235770 A1    Aug. 21, 2014

(30) Foreign Application Priority Data
Sep. 27, 2011 (FR) ...................................... 11 58628

(51) Int. Cl.
| | |
|---|---|
| C08L 77/06 | (2006.01) |
| C08K 3/22 | (2006.01) |
| C08K 3/28 | (2006.01) |
| C08K 5/5313 | (2006.01) |
| C08K 5/3492 | (2006.01) |
| H01B 3/30 | (2006.01) |
| C08K 5/52 | (2006.01) |
| C08K 7/14 | (2006.01) |
| C08K 5/521 | (2006.01) |
| H01L 33/64 | (2010.01) |
| C09K 21/12 | (2006.01) |

(52) U.S. Cl.
CPC ............ *H01B 3/305* (2013.01); *C08K 3/22* (2013.01); *C08K 3/28* (2013.01); *C08K 5/34922* (2013.01); *C08K 5/521* (2013.01); *C08K 5/5205* (2013.01); *C08K 5/5313* (2013.01); *C08K 7/14* (2013.01); *C08L 77/06* (2013.01); C08K 2003/2227 (2013.01); C08K 2003/2248 (2013.01); C08K 2003/2265 (2013.01); C08K 2003/2296 (2013.01); C09K 21/12 (2013.01); H01L 33/641 (2013.01)

(58) Field of Classification Search
CPC ... C08K 3/20; C08K 3/22; C08K 3/28; C08K 3/38; C08L 77/00
See application file for complete search history.

(56) References Cited

U.S. PATENT DOCUMENTS

| | | | |
|---|---|---|---|
| 4,036,811 A * | 7/1977 | Noetzel et al. ............... 524/126 |
| 4,702,859 A | 10/1987 | Shimizu et al. | |
| 6,160,080 A | 12/2000 | Cucinella et al. | |
| 6,211,402 B1 | 4/2001 | Kleiner | |
| 6,255,371 B1 | 7/2001 | Schlosser et al. | |
| 6,344,158 B1 | 2/2002 | Schlosser et al. | |
| 6,365,071 B1 | 4/2002 | Jenewein et al. | |
| 6,525,166 B1 | 2/2003 | Di Silvestro et al. | |
| 8,592,549 B1 * | 11/2013 | Grcev ..................... C08J 3/226 524/136 |
| 8,946,333 B2 * | 2/2015 | Raman ................. B29C 47/385 428/403 |
| 2009/0286914 A1* | 11/2009 | Crowe et al. ................. 524/404 |
| 2010/0072416 A1* | 3/2010 | Fujioka et al. ................ 252/67 |
| 2011/0027565 A1 | 2/2011 | Kakehashi | |
| 2011/0155948 A1* | 6/2011 | Namkung .............. C08L 77/00 252/74 |
| 2013/0030105 A1* | 1/2013 | Shimokoba et al. ......... 524/404 |
| 2014/0166925 A1* | 6/2014 | Chen ........................ C08K 3/38 252/75 |
| 2014/0252265 A1* | 9/2014 | Gabriel .................. C08L 23/00 252/75 |

FOREIGN PATENT DOCUMENTS

| | | |
|---|---|---|
| CN | 102070899 A | 11/2011 |
| EP | 2078736 A1 | 7/2009 |
| FR | 2596567 A1 | 10/1987 |
| JP | 2009167358 A * | 7/2009 |
| JP | 2009167358 A2 | 7/2009 |
| JP | 2009167359 A2 | 7/2009 |
| JP | 2009185102 A2 | 8/2009 |
| JP | 2009202567 A2 | 9/2009 |
| JP | 2009263476 A2 | 11/2009 |
| WO | 9724388 A1 | 7/1997 |
| WO | 9964496 A1 | 12/1999 |
| WO | WO 2011125545 A1 * | 10/2011 |

OTHER PUBLICATIONS

Machine translated English language equivalent of JP 2009-167358 (Jul. 2009, 11 pages).*
Horold (A New Generation of Flame Retarded Polyamides based on Phosphinates. Chemical Business. 19(10). 7 pages). 2005.*
"Musubu Ichikawa, et al. Organic Thin-Film Transistors with Conductive Metal-Oxides as Source-Drain ElectrodesJapanese Journal of Applied Physics, 2006 vol. 45, Part 2, Nos. 42-45".

* cited by examiner

*Primary Examiner* — Brieann R Johnston
(74) *Attorney, Agent, or Firm* — Osha Liang LLP

(57) ABSTRACT

The present invention relates to a composition containing a polyamide matrix having high thermal conductivity, and including a nitride and a metal oxide, as well as, optionally, a flame-retardant system. Said composition can be used in particular for producing components for lighting apparatuses including light-emitting diodes.

15 Claims, No Drawings

POLYAMIDE COMPOSITION HAVING HIGH THERMAL CONDUCTIVITY

RELATED APPLICATIONS

This application is a U.S. national stage entry under 35 U.S.C. § 371 of International Application No. PCT/EP/2012/068837, filed Sep. 25, 2012, which claims priority to FR 1158628 filed on Sep. 27, 2011. The entire contents of these applications are explicitly incorporated herein by this reference.

The present invention relates to a composition based on polyamide matrix and exhibiting a high thermal conductivity and comprising a nitride and a metal oxide, and also, possibly, a flame-retardant system. This composition may be used in particular for producing components for lighting devices comprising light-emitting diodes.

PRIOR ART

Polyamide is a synthetic polymer widely used for the manufacture of a variety of articles, such as moldings and/or injection moldings. Industrial polyamides are used for the preparation of numerous articles in various fields, such as the motor vehicle, electrical or electronics field, where specific properties of stiffness, of impact strength, of dimensional stability, in particular at relatively high temperatures, of surface appearance, of density and of weight are particularly desired. The choice of a material for a given application is generally guided by the level of performance required with regard to certain properties and by its cost. Indeed, novel materials capable of meeting requirements in terms of performance and/or costs are always sought after.

It is known from the prior art to use industrial polyamides exhibiting a good thermal conductivity for various applications, in particular in the electrical and electronics fields, when they are used with semiconductors, engines or components which emit or interact with light. As such, light-emitting diodes (LEDs) are electronic components capable of emitting light when they are traversed by an electrical current, this electrical current generating strong heat which it is then advisable to dissipate in order to prevent hotspots and resulting damage.

It is known to employ components made of polyamide for the preparation of such articles comprising LEDs by using additives capable of increasing the thermal conductivity of the polyamide, such as graphite or boron nitride, for example. However, the use of graphite in the polyamide also results in a strong increase in the electrical conductivity, as mentioned in particular in the document FR 2 596 567.

There thus exists a need to devise polyamide-based compositions exhibiting a high thermal conductivity and also a low electrical conductivity, that is to say good electrical insulation, while exhibiting a good compromise in mechanical and flame-retardant properties for various applications.

Furthermore, it was known that alumina, when it is used in very high proportions in the polyamide, makes it possible to confer a degree of thermal conductivity. However, such a proportion of alumina in the matrix causes a drastic deterioration in the mechanical and rheological properties of the polyamide composition.

INVENTION

The applicant has just demonstrated that the combination of a nitride, of a p-block element from the Periodic Table of the Elements, in the presence of a metal oxide, allowed the aforementioned problems to be resolved and allowed polyamide compositions to be obtained that exhibit a high thermal conductivity and also an appropriate electrical conductivity, while exhibiting a good compromise in mechanical and flame-retardant properties.

A first subject matter of the present invention is thus a composition comprising at least:
- a polyamide matrix;
- a metal oxide; and
- a nitride of a p-block element from the Periodic Table of the Elements; and optionally
- a flame-retardant system.

The polyamide matrix preferably comprises a thermoplastic polyamide and more preferably a semicrystalline thermoplastic polyamide. Semicrystalline aliphatic or semiaromatic polyamides are especially preferred.

The polyamide of the invention is selected in particular from the group consisting of polyamides obtained by polycondensation of at least one aliphatic dicarboxylic acid with an aliphatic or cyclic or cycloaliphatic or arylaliphatic diamine, such as PA 6.6, PA 6.10, PA 6.12, PA 10.10, PA 10.6, PA 12.12, PA 4.6, MXD 6 or PA 92, or between at least one aromatic dicarboxylic acid and an aliphatic or aromatic diamine, such as polyterephthalamides, polyisophthalamides or polyaramids, or a blend thereof and (co)polyamides thereof. The polyamide of the invention may also be chosen from polyamides obtained by polycondensation of at least one amino acid or lactam with itself, it being possible for the amino acid to be generated by hydrolytic opening of a lactam ring, such as, for example, PA 6, PA 7, PA 11, PA 12 or PA 13, or a blend thereof and (co)polyamides thereof. Mention may in particular be made of polyamide 6/6.6 as a type of copolyamide.

Polyamides of type 6 and polyamides of type 6.6 are particularly preferred. Polyamide of type 6 is understood to mean in particular a polyamide comprising at least 90% by weight of caprolactam or aminocaproic monomer residues. Polyamide of type 6.6 is understood in particular to mean a polyamide comprising at least 90% by weight of adipic acid and hexamethylenediamine monomer residues.

The polyamides can exhibit an apparent melt viscosity of between 10 and 1200 Pa·s, measured according to the ISO 11443 standard at a shear rate of 1000 s$^{-1}$ and a temperature of 250° C., in particular for polyamides of type 6; or an apparent melt viscosity of between 10 and 700 Pa·s, measured according to the ISO 11443 standard at a shear rate of 1000 s$^{-1}$ and a temperature of 280° C., in particular for polyamides of type 6.6.

Use may especially be made of polyamides of variable molecular weights by addition, before or during the polymerization of the polyamide monomers, or else in melt extrusion, of monomers that modify the length of the chains such as, in particular, difunctional and/or monofunctional compounds bearing amine or carboxylic acid functions that are capable of reacting with the polyamide monomers or the polyamide.

The term "carboxylic acid" means carboxylic acids and derivatives thereof, for instance acid anhydrides, acid chlorides and esters. The term "amine" means amines and their derivatives that are capable of forming an amide linkage.

It is possible to use, at the start of, during or at the end of the polymerization, any type of aliphatic or aromatic monocarboxylic or dicarboxylic acid or any type of aliphatic or aromatic monoamine or diamine amine.

Use may very particularly be made of a polyamide obtained at least from adipic acid and hexamethylenediamine or from their salts, such as hexamethylenediamine adipate, which can optionally comprise various proportions of other polyamide monomers. To this end, mention may be made of polyamide 6.6/6.T.

Polyamides according to the invention can also be obtained by blending, in particular melt blending. It is possible, for example, to blend a polyamide with another polyamide, or a polyamide with a polyamide oligomer, or else a polyamide with monomers which modify the length of the chains, such as, in particular, diamines, dicarboxylic acids, monoamines and/or monocarboxylic acids. It is possible, in particular, to add isophthalic acid, terephthalic acid or benzoic acid to the polyamide, for example at contents of approximately 0.2% to 2% by weight.

The composition of the invention may further comprise copolyamides derived in particular from the above polyamides, or the blends of these polyamides or (co)polyamides.

Use may also be made of branched polyamides of high melt flow, in particular obtained by blending, during polymerization, in the presence of the polyamide monomers, at least one multifunctional compound comprising at least 3 identical reactive functions of amine function or carboxylic acid function type.

Use may also be made, as polyamide of high melt flow, of a star polyamide comprising star macromolecular chains and, if appropriate, linear macromolecular chains. Polymers comprising such star macromolecular chains are described, for example, in the documents WO97/24388 and WO99/64496.

These star polyamides are in particular obtained by blending, during polymerization, in the presence of the polyamide monomers, an amino acid or lactam, such as caprolactam, at least one multifunctional compound comprising at least 3 identical reactive functions of amine function or carboxylic acid function type.

The composition can comprise, in addition to the modified polyamide of the invention, one or more other polymers, preferably polyamides or copolyamides. The composition can also comprise, depending on the desired final property, a blend of modified polyamide according to the invention and one or more other polymers, such as, for example, polyamide, polyester, polyolefins, polystyrene, ABS resin, polycarbonate, polyphenylene sulfide, polyphenylene oxide, polyacetal, polysulfone, polyethersulfone, polyetherimide, polyetherketone, a polylactic acid resin, a polysulfone resin, an elastomeric resin or blends of these.

The composition according to the invention can comprise between 20% and 80% by weight, preferentially between 20% and 60% by weight and more preferentially between 25% and 55% by weight of polyamide, with respect to the total weight of the composition.

A metal oxide is a body consisting of metal atoms and oxygen atoms. The metal may be a transition metal or a so-called poor metal, such as, for example, zinc, iron, copper, and aluminum. The metal oxide according to the invention may be selected from the group consisting of the following: zinc oxides, iron oxides, copper oxides and aluminum oxides. The metal oxide according to the invention may in particular be selected from the group consisting of the following: aluminum oxide $Al_2O_3$, zinc oxide ZnO, cuprous oxide $C_2uO$, cupric oxide CuO, iron(II) oxide, iron(II, III) oxide, and iron(III) oxide, although others may equally be used.

These metal oxides may take a variety of forms with particles having in particular a mean size of between 0.1 and 100 μm.

Alumina or aluminum oxide is a compound of chemical formula $Al_2O_3$ which may take the form of particles having in particular a mean size of between 0.1 and 100 μm. The alumina can in particular exhibit a mean size of less than 50 μm.

The composition according to the present invention comprises preferably from 2% to 30% by weight of metal oxide, more preferably from 5% to 25% by weight, in particular from 10% to 20% by weight, the percentages by weight being expressed with respect to the total weight of the composition.

The composition according to the invention therefore comprises a nitride of a p-block element from the Periodic Table of the Elements. Nitrides are compounds in which nitrogen is at the –III oxidation number. The p-block is composed of the elements present in columns 13 to 18 of the Periodic Table of the Elements, and comprises, in particular, the metallic and metalloid elements. They are given this name because their highest-energy occupied orbital is of type p. The metalloids form a diagonal band in the Periodic Table, between the metals and the nonmetals. Metalloids include boron and silicon, for example.

The nitride of the p-block element from the Periodic Table of the Elements is preferably selected from the group consisting of the following: boron nitride, aluminum nitride, titanium nitride, and silicon nitride. It is possible to add various nitrides of a p-block element to the composition according to the invention.

Particular preference is given to boron nitride, which may take a variety of presentations, such as, for example, in amorphous form, in hexagonal crystalline form, or in cubic crystalline form. The boron nitride may take the form of platelets or nanotubes, for example. The mean size of the nitrides of a p-block element may between 5 and 150 μm.

The composition according to the present invention comprises preferably from 2% to 30% by weight of nitride of a p-block element from the Periodic Table of the Elements, more preferably from 5% to 25% by weight, in particular from 10% to 20% by weight, the percentages by weight being expressed with respect to the total weight of the composition.

The flame-retardant system according to the present invention can comprise flame retardants of any type, that is to say compounds which make it possible to reduce flame propagation and/or which have flame-retardant properties, which are well known to a person skilled in the art. These flame retardants are normally used in flame-retardant compositions and are described in particular, for example, in patents U.S. Pat. No. 6,344,158, U.S. Pat. No. 6,365,071, U.S. Pat. No. 6,211,402 and U.S. Pat. No. 6,255,371, cited herein by way of reference.

Advantageously, the flame-retardant system comprises at least one flame retardant selected from the group consisting of:
  flame retardants containing phosphorus, such as:
    phosphine oxides such as, for example, triphenylphosphine oxide, tri(3-hydroxypropyl)phosphine oxide and tri(3-hydroxy-2-methylpropyl)phosphine oxide.
    phosphonic acids or salts thereof or phosphinic acids or salts thereof, such as, for example, the zinc, magnesium, calcium, aluminum or manganese salts of phosphinic acids, particularly the aluminum salt of diethylphosphinic acid or the zinc salt of dimethylphosphinic acid.
    cyclic phosphonates, such as esters of cyclic diphosphate, such as Antiblaze 1045, for example.
    organic phosphates, such as triphenyl phosphate.

inorganic phosphates, such as ammonium polyphosphates and sodium polyphosphates.

red phosphorus, whether in stabilized form or coated form, as a powder, or in the form of masterbatches, for example.

flame retardants of nitrogen-containing organic compound type, such as, for example, triazines, cyanuric acid and/or isocyanuric acid, melamine or its derivatives, such as melamine cyanurate, melamine oxalate, phthalate, borate, sulfate, phosphate, polyphosphate and/or pyrophosphate, condensed melamine products, such as melem, melam and melon, tri(hydroxyethyl) isocyanurate, benzoguanamine, guanidine, allantoin and glycoluril.

flame retardants containing halogenated derivatives, such as:
bromine derivatives such as, for example, PBDPOs (polybromodiphenyl oxides), BrPS (brominated polystyrene and polybromostyrene), poly(pentabromobenzyl acrylate), brominated indane, tetradecabromo-diphenoxybenzene (Saytex 120), 1,2-bis (pentabromophenyl)-ethane or Saytex 8010 from Albemarle, tetrabromobisphenol A and brominated epoxy oligomers. Mention may in particular be made, among brominated derivatives, of polydibromostyrene, such as PDBS-80 from Chemtura, brominated polystyrenes, such as Saytex HP 3010 from Albemarle or FR-803P from Dead Sea Bromine Group, decabromodiphenyl ether (DBPE) or FR-1210 from Dead Sea Bromine Group, octabromodiphenyl ether (OBPE), 2,4,6-tris(2,4,6-tribromophenoxy)-1,3,5-triazine or FR-245 from Dead Sea Bromine Group, poly(pentabromobenzyl acrylate) or FR-1025 from Dead Sea Bromine Group, and epoxy-terminated oligomers or polymers of tetrabromobisphenol A, such as F-2300 and F-2400 from Dead Sea Bromine Group.
chlorinated compounds, such as, for example, a chlorinated cycloaliphatic compound such as Dechlorane Plus® (sold by OxyChem, see CAS 13560-89-9).

The flame-retardant system preferably comprises at least one phosphonic acid or its salt or one phosphinic acid or its salt.

These compounds may be used alone or in combination, sometimes synergistically. Preference is given in particular to a synergistic combination of phosphorus-comprising compounds, such as phosphine oxides, phosphonic acids or salts thereof or phosphinic acids or salts thereof, and cyclic phosphonates, with nitrogen-comprising derivatives, such as melam, melem, melamine phosphate, melamine polyphosphates, melamine pyrophosphates or ammonium polyphosphates.

The composition can comprise from 5% to 30% by weight of flame retardants, with respect to the total weight of the composition, in particular in the context of the use of flame retardants containing phosphorus, such as phosphinic acids or their salts.

The composition can comprise reinforcing or bulking fillers, such as, for example, fibrous fillers and/or nonfibrous fillers. Mention may be made, as fibrous fillers, of glass fibers, carbon fibers, natural fibers, aramid fibers and nanotubes, in particular carbon nanotubes. Mention may be made, as natural fibers, of hemp and flax. Mention may in particular be made, among nonfibrous fillers, of all particulate or lamellar fillers and/or exfoliable or nonexfoliable nanofillers, carbon black, aluminosilicate clays, montmorillonites, zirconium phosphate, kaolin, calcium carbonate, diatomaceous earths, graphite, mica, silica, titanium dioxide, zeolites, talc, wollastonite, polymeric fillers, such as, for example, dimethacrylate particles, glass beads or glass powder. The concentration by weight of the reinforcing fillers can advantageously be between 1% and 50% by weight, preferably between 15% and 50% by weight, with respect to the total weight of the composition.

The compositions of the invention can also comprise any additive normally used in polyamide-based compositions used for the manufacture of molded or extruded articles. Thus, mention may be made, as examples of additives, of heat stabilizers, U.V. stabilizers, antioxidants, lubricants, pigments, dyes, plasticizers or impact strength modifiers. By way of example, the antioxidants and heat stabilizers are, for example, alkali metal halides, copper halides, sterically hindered phenolic compounds or aromatic amines. The U.V. stabilizers are generally benzotriazoles, benzophenones or HALSs.

There is no limitation on the types of impact strength modifiers. It is generally elastomeric polymers which can be used for this purpose. Examples of suitable elastomers are ethylene/acrylic ester/maleic anhydride copolymers, ethylene/propylene/maleic anhydride copolymers or EPDM (ethylene/propylene/diene monomer) copolymers with optionally a grafted maleic anhydride. The concentration by weight of elastomer is advantageously between 0.1% and 15%, with respect to the total weight of the composition.

The composition according to the present invention preferably comprises:
a polyamide matrix;
a metal oxide; and
a nitride of a p-block element from the Periodic Table of the Elements;
optionally a flame-retardant system;
optionally a reinforcing or bulking filler;
optionally an additive selected from the group consisting of the following: heat stabilizers, U.V. stabilizers, antioxidants, lubricants, pigments, dyes, plasticizers or impact strength modifiers.

The compositions of the invention are obtained by blending the various constituents, generally in a single- or twin-screw extruder, at a temperature sufficient to keep the polyamide resin as a molten medium. Generally, the blend obtained is extruded in the form of rods which are cut into pieces in order to form granules. The additives such as the nitride and the metal oxide may be added together or separately to the polyamide, by mixing cold or with heating.

The addition of the compounds and additives can be carried out by addition of these compounds to the molten polyamide in the pure form or in the form of a concentrated blend in a resin, such as, for example, a polyamide resin.

The granules obtained may be used as a raw material for feeding the methods for manufacturing articles, such as injection processes, injection molding processes, extrusion processes and extrusion-blow molding processes. The article according to the invention can in particular be an extruded or injected article.

The invention also relates to articles obtained by shaping the composition of the invention, by any plastic transformation technique, such as, for example, by extrusion, such as, for example, extrusion of sheets and films or extrusion-blow molding; by molding, such as, for example, compression molding, thermoforming molding or rotational molding; or by injection, such as, for example, injection molding or injection-blow molding.

Thus, the composition of the invention is particularly suitable for the manufacture of articles used in the field of electrical or electronic connections, such as elements of circuit breakers, switches, connectors or the like.

The composition according to the invention is particularly suitable for the manufacture of components associated with light-emitting diodes, such as packages, housings, supports, reflectors, cases, lids, sockets, bases or others, or of components associated with semiconductors or others in which the component makes it possible to discharge the amount of heat given off by the light-emitting diodes in operation. These components are particularly manufactured by shaping the composition according to the invention by extrusion, molding or injection.

Another subject matter of the present invention is a lighting device comprising at least one light-emitting diode and one component obtained from a polyamide composition as described above. The invention relates in particular to a diode lamp or semiconductor light-emitting source comprising at least one light-emitting diode and one component obtained from a polyamide composition as described above. Preferably, the LEDs are high-power LEDs, each with a power of greater than 10 W. The LEDs are preferably produced on one and the same wafer of semiconductor material.

A specific language is used in the description so as to facilitate understanding of the principle of the invention. Nevertheless, it should be understood that no limitation on the scope of the invention is envisaged by the use of this specific language. Modifications, improvements and refinements can in particular be envisaged by a person conversant with the technical field concerned on the basis of his own general knowledge.

The term "and/or" includes the meanings and, or all the other possible combinations of the elements connected to this term.

Other details or advantages of the invention will become more clearly apparent in the light of the examples given below purely by way of indication.

Experimental Section

Compounds used:
Polyamide 6.6 with a relative viscosity of 2.7 (according to the standard ISO 307, using sulfuric acid as solvent), sold by Rhodia Engineering Plastics under the name Technyl® 27 A00.
Aluminum oxide/Alumine KAM
Zinc oxide/KS-1 SB chemical
Boron nitride/BN-08 Zibo Jonye Ceramic Technology)
Glass fiber/OCV 983 Owens Corning Vetrotex
Flame-retardant system: Exolit® OP1230 from Clariant and Melapur® 200 melamine polyphosphate (MPP)
Formulation additives: heat stabilizers and lubricants.

In order to manufacture compositions comprising varied proportions of additives and filler, the polyamide and the various additives are blended by extrusion, via a twin-screw extruder (barrel temperature: 250-290° C., flow rate: 30 kg/h, rotation: 250 rpm). The final compositions are then extruded and granulated, and then injection molded. The results are set out in table 1, in which the proportions are expressed in percentage by weight, with respect to the total weight of the composition.

TABLE 1

| Composition | C1 | C2 | C3 | 1 | 2 | 3 | 4 |
|---|---|---|---|---|---|---|---|
| PA 6.6 | 74.8 | 45 | 45 | 44.8 | 44.8 | 34.8 | 44.8 |
| Boron nitride | — | — | 24 | 15 | 20 | 15 | 15 |
| Alumina | — | 24 | — | 15 | 10 | 25 | — |

TABLE 1-continued

| Composition | C1 | C2 | C3 | 1 | 2 | 3 | 4 |
|---|---|---|---|---|---|---|---|
| Zinc oxide | — | — | — | — | — | — | 15 |
| GF | 5 | 5 | 5 | 5 | 5 | 5 | 5 |
| Exolit | 12.7 | 16.4 | 16.4 | 12.7 | 12.7 | 12.7 | 12.7 |
| MPP | 6.4 | 8.3 | 8.3 | 6.4 | 6.4 | 6.4 | 6.4 |
| Additives | 1.1 | 1.3 | 1.3 | 1.1 | 1.1 | 1.1 | 1.1 |
| Surface resistivity ASTM D257 (log ohm square) | $10^{15}$ | $10^{15}$ | $10^{15}$ | $10^{15}$ | $10^{15}$ | $10^{15}$ | $10^{15}$ |
| Thermal conductivity ASTM E1461 (W/mK) | 0.1 | 1.1 | 1.6 | 2.0 | 1.8 | 2.0 | 2.0 |
| UL 94 @ 0.8 mm | V-0 | V-0 | V-0 | V-0 | V-0 | V-0 | V-0 |
| Flexural modulus ASTM D790 (kgf/cm$^2$) | 45000 | 57000 | 60000 | 69000 | 75000 | 85000 | 65000 |
| HDT @ 18.5 kgf/cm$^2$ (° C.) | 230 | 207 | 210 | 211 | 224 | 218 | 208 |

The "In Plane" thermal conductivity is measured in accordance with standard ASTM E1461 (*Standard Test Method for Thermal Diffusivity by the Flash Method*).

It is thus observed that the combination according to the invention in the polyamide composition allows a unique balance to be obtained between mechanical properties, resistivity to electrical current, and thermal conductivity, thereby making this composition suitable for the manufacture of articles for applications associated with semiconductors or with light-emitting diodes.

Tests were likewise carried out using formulations which were similar but comprising a combination of alumina and aluminum nitride. The final components are observed to have a thermal conductivity greater than that from comparative tests C1, C2 and C3.

The invention claimed is:

1. A composition comprising at least:
   from 20% to 80% by weight of a polyamide selected from the group consisting of PA 66, PA 610, PA 612, PA 1010, PA 106, PA 1212, PA 46, MXD 6, PA 92, PA 6, PA 7, PA 11, PA 12, PA13, PA 6/66, and mixtures thereof,
   from 2% to 30% by weight of a metal oxide selected from the group consisting of the following: zinc oxides, iron oxides, copper oxides, and aluminum oxides,
   from 2% to 30% by weight of a nitride compound selected from the group consisting of the following: boron nitride, aluminum nitride, titanium nitride, and silicon nitride,
   from 5% to 30% by weight of a flame-retardant system comprising at least one phosphinic acid or salts thereof, and at least one melamine polyphosphate; and
   from 1% to 50% by weight of glass fibers.

2. The composition as claimed in claim 1, wherein the flame-retardant system further comprises at least one flame retardant containing halogenated derivatives.

3. The composition as claimed in claim 1, wherein the polyamide is PA 66, PA 6, or mixtures thereof.

4. The composition as claimed in claim 1, wherein the metal oxide is selected from the group consisting of iron oxides, copper oxides, and aluminum oxides.

5. The composition as claimed in claim 1 comprising from 20% to 60% by weight of the polyamide.

6. The composition as claimed in claim 1 comprising from 25% to 55% by weight of the polyamide.

7. The composition as claimed in claim 1 comprising from 5% to 25% by weight of the metal oxide.

8. The composition as claimed in claim 1 comprising from 10% to 20% by weight of the metal oxide.

9. The composition as claimed in claim 1 comprising from 5% to 25% by weight of the nitride of the p-block element.

10. The composition as claimed in claim 1 comprising from 10% to 20% by weight of the nitride of the p-block element.

11. The compositions as claimed in claim 1 comprising 1% to 15% of the glass fibers.

12. The composition as claimed in claim 1, wherein the boron nitride is in hexagonal crystalline form.

13. A component associated with light-emitting diodes, comprising the composition as claimed in claim 1.

14. The component as claimed in claim 13, manufactured by shaping the composition by extrusion, molding or injection.

15. A lighting device comprising at least one light-emitting diode and one component comprising a composition as claimed in claim 1.

\* \* \* \* \*